(12) United States Patent
Ge et al.

(10) Patent No.: US 11,630,231 B2
(45) Date of Patent: Apr. 18, 2023

(54) DOWNHOLE TOOL WITH RECEIVE ANTENNA AND PROXIMATE AMPLIFIER

(71) Applicant: Halliburton Energy Services, Inc., Houston, TX (US)

(72) Inventors: Liang Ge, Singapore (SG); Chin Wee Lim, Singapore (SG); Heen Wei Ng, Singapore (SG); Lucas Samuel Batista Santos, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 16 days.

(21) Appl. No.: 17/464,386

(22) Filed: Sep. 1, 2021

(65) Prior Publication Data

US 2023/0069300 A1    Mar. 2, 2023

(51) Int. Cl.
*G01V 3/28*    (2006.01)
*H01Q 1/04*    (2006.01)
*H03F 1/26*    (2006.01)

(52) U.S. Cl.
CPC .............. *G01V 3/28* (2013.01); *H01Q 1/04* (2013.01); *H03F 1/26* (2013.01)

(58) Field of Classification Search
None
See application file for complete search history.

(56) References Cited

U.S. PATENT DOCUMENTS

| | | | |
|---|---|---|---|
| 7,277,725 B1 | 10/2007 | Henry et al. | |
| 2007/0229082 A1* | 10/2007 | Vehra | G01V 3/30 324/339 |
| 2018/0138992 A1* | 5/2018 | Kraft | H04B 17/12 |
| 2018/0156936 A1 | 6/2018 | Zhang | |
| 2019/0219726 A1* | 7/2019 | Ramirez | G01V 3/32 |
| 2019/0293830 A1 | 9/2019 | Griffing et al. | |
| 2021/0103069 A1 | 4/2021 | Jin et al. | |
| 2021/0108468 A1 | 4/2021 | Prakash et al. | |
| 2021/0111487 A1 | 4/2021 | Griffing et al. | |
| 2023/0025566 A1* | 1/2023 | Wilson | G01V 3/38 |

OTHER PUBLICATIONS

Foreign Communication from Related Application—International Search Report and Written Opinion of the International Searching Authority, International Application No. PCT/US2021/048963, dated May 24, 2022, 9 pages.

Electronic Filing Receipt, Specification and Drawings for International Application No. PCT/US2021/048963, entitled "Downhole Tool With Receive Antenna and Proximate Amplifier," filed Sep. 3, 2021, 36 pages.

* cited by examiner

*Primary Examiner* — Douglas X Rodriguez
(74) *Attorney, Agent, or Firm* — Conley Rose, P.C.; Rodney B. Carroll

(57) ABSTRACT

A downhole tool includes a receive antenna configured to receive a signal from a surrounding formation, and a receive amplifier proximate to and coupled to the receive antenna. The receive amplifier is configured to provide an amplified signal responsive to the signal received by the receive antenna. The downhole tool also includes an electronics carrier, including receive circuitry, coupled to the receive amplifier by a conductor. The electronics carrier is positioned axially away from the receive antenna and the receive amplifier, and the receive circuitry is configured to receive and process the amplified signal.

18 Claims, 6 Drawing Sheets

DOWNHOLE TOOL WITH RECEIVE ANTENNA AND PROXIMATE AMPLIFIER

TECHNICAL FIELD

This present disclosure relates generally to amplification of received signals in downhole tools, with a transmitter in close proximity of a receiver. In at least one example, the present disclosure relates to a downhole tool including a receive antenna and a proximate receive amplifier.

BACKGROUND

Wellbores are drilled into the earth for a variety of purposes, including accessing hydrocarbon-bearing formations. A variety of downhole tools may be used within a wellbore in connection with accessing and extracting such hydrocarbons. Various sensors may be included in the downhole tools, in order to collect data regarding the wellbore and surrounding formation. The downhole tools may require instructions and/or may need to pass along data obtained by the sensors. In order to transmit and receive data, the sensors are connected to electronic components, such as controllers. The placement and manner of connecting the sensors is often constrained by the small space available in the downhole tools.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
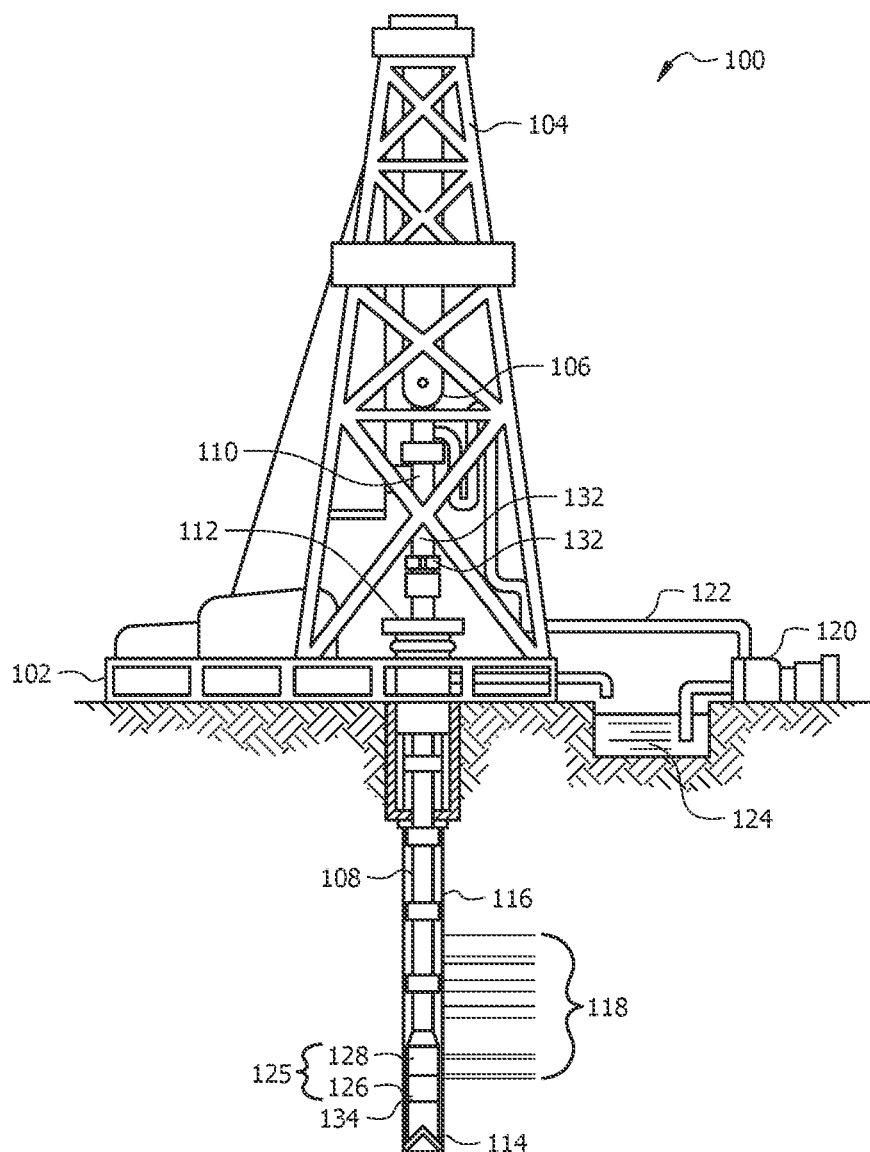
FIG. 1A is a diagram illustrating an exemplary environment for a downhole tool with a receive antenna and proximate amplifier according to the present disclosure.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a receiver sensor, which may include a receive antenna and a receive amplifier proximate to and coupled to the receive antenna, for use in a transmitter- and receiver-based downhole tool, which can include any or all of the following features or aspects in any given example. A transmitter- and receiver-based downhole tool may communicate and exchange signals with a surface device, such as a surface computer, to control the downhole tool and to receiver sensor data collected by the downhole tool. To enable such information exchange, the tool is equipped with an electronics carrier to control the operation of the downhole tool, as well as regulate the content and timing of signal transmissions between the surface computer and the downhole tool. The downhole tool is also equipped with transmitter sensors and receiver sensors, which may be or include antennas that transmit and receive signals, respectively. The electronics carrier is communicatively and structurally coupled with the transmitter and receiver sensors via a connector ring and/or various conductors, such as wires passing through gun drill holes of the downhole tool body.

In some cases, it is useful to combine transmitter electronics and receiver electronics (e.g., controller(s)) into a single insert, or electronics carrier, in a downhole tool. For example, a downhole tool that combines transmitter and receiver electronics into a single electronics carrier may be cheaper than a downhole tool that uses a transmitter electronics carrier and a separate receiver electronics carrier. As another example, a downhole tool that combines transmitter and receiver electronics into a single electronics carrier may be shorter in length, or otherwise have a reduced form factor, relative to a downhole tool that uses a transmitter electronics carrier and a separate receiver electronics carrier. As yet another example, a downhole tool that combines transmitter and receiver electronics into a single electronics carrier may reduce inventory costs by simplifying the bill of materials for the downhole tool (e.g., manufacturing or assembling the downhole tool with a single electronics carrier versus a transmitter electronics carrier and a separate receiver electronics carrier).

However, proximity between transmitter electronics and receiver electronics (e.g., in the single electronics carrier) may lead to unwanted coupling between transmitter and receiver signals. This unwanted coupling is known as crosstalk, and may lead to undesired behavior such as measurement offset and/or errors. Conventionally, designs of downhole tools separate the transmitter and receiver electronics to reduce crosstalk between transmitter and receiver signals. However, as described above, designs that use separate electronics carriers for transmitters and receivers may increase the length and cost of transmitter/receiver sensor-based tools.

To address the foregoing, disclosed herein are methods, assemblies, and systems that provide a receive antenna and a receive amplifier proximate to and coupled to the receive antenna, such as for use in a downhole tool. In some cases, the receive antenna and receive amplifier are integrated into a single receiver sensor, or insert. For example, the receive antenna and receive amplifier may be co-located on a receiver circuit board of the receiver sensor. The receive amplifier is configured to amplify a signal received by the receive antenna before the signal is transmitted to an electronics carrier of the downhole tool. Accordingly, the impact of noise or interference (e.g., crosstalk) on the received signal is reduced.

For example, amplifying the received signal proximate to the receive antenna, before the received signal is transmitted to the electronics carrier, results in a higher signal-to-noise ratio (SNR) for the received signal, even accounting for noise that is added to the amplified, received signal while it is transmitted (e.g., environmental noise). The examples described herein also result in a higher SNR when considering noise that is added to the amplified, received signal by the transmitter electronics of the single electronics carrier. Thus, a single electronics carrier is able to be used to reduce logging tool length and cost, while also reducing crosstalk (e.g., by improving SNR of the received signals) between receiver and transmitter electronics of the electronics carrier.

The receive antenna and proximate amplifier can be employed in an exemplary wellbore operating environment 100 shown, for example, in FIG. 1A. FIG. 1A illustrates a schematic view of a wellbore operating environment 100 in accordance with some examples of the present disclosure. As depicted in FIG. 1A, a drilling platform 102 can be equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, the drill bit 114 creates a wellbore 116 that passes through various subterranean formations 118. A pump 120 circulates drilling fluid through a supply pipe 122 to top drive 110, down through the interior of drill string 108 and orifices in drill bit 114, back to the surface via the annulus around drill string 108, and into a retention pit 124. The drilling fluid transports cuttings from the wellbore 116 into the retention pit 124 and aids in maintaining the integrity of the wellbore 116. Various materials can be used for drilling fluid, including oil-based fluids and water-based fluids.

The drill string 108 may include the downhole tool 200 of FIG. 2, described further below. For example, logging tools 126, which may be or include a downhole tool 200 of FIG. 2, can be integrated into a bottom-hole assembly (BHA) 125 near the drill bit 114 for carrying out measure while drilling (MWD) or logging while drilling (LWD) operations. As the drill bit 114 extends the wellbore 116 through the formations 118, logging tool(s) 126 collect measurements relating to various formation properties as well as the orientation of the tool and various other drilling conditions. The BHA 125 may also include a telemetry sub 128 to transfer measurement data to a surface receiver 132 and to receive commands from the surface. In at least some cases, the telemetry sub 128 communicates with a surface receiver 132 using mud pulse telemetry. In some cases, the telemetry sub 128 does not communicate with the surface, but rather stores logging data for later retrieval at the surface when the logging assembly is recovered.

Each of the logging tools 126 may include one or more tool components spaced apart from each other and communicatively coupled by one or more wires and/or other media for LWD and MWD operations. The logging tools 126 may also include one or more computing devices 134 communicatively coupled with one or more of the tool components by one or more wires and/or other media. The one or more computing devices 134 may be configured to control or monitor a performance of the tool, process logging data, and/or carry out one or more aspects of the methods and processes of the present disclosure.

In at least one example, one or more of the logging tools 126 may communicate with a surface receiver 132 by a wire, such as wired drillpipe. In other cases, the one or more of the logging tools 126 may communicate with a surface receiver 132 by wireless signal transmission. In at least some cases, one or more of the logging tools 126 may receive electrical power from a wire that extends to the surface, including wires extending through a wired drillpipe.

Figure 1B:
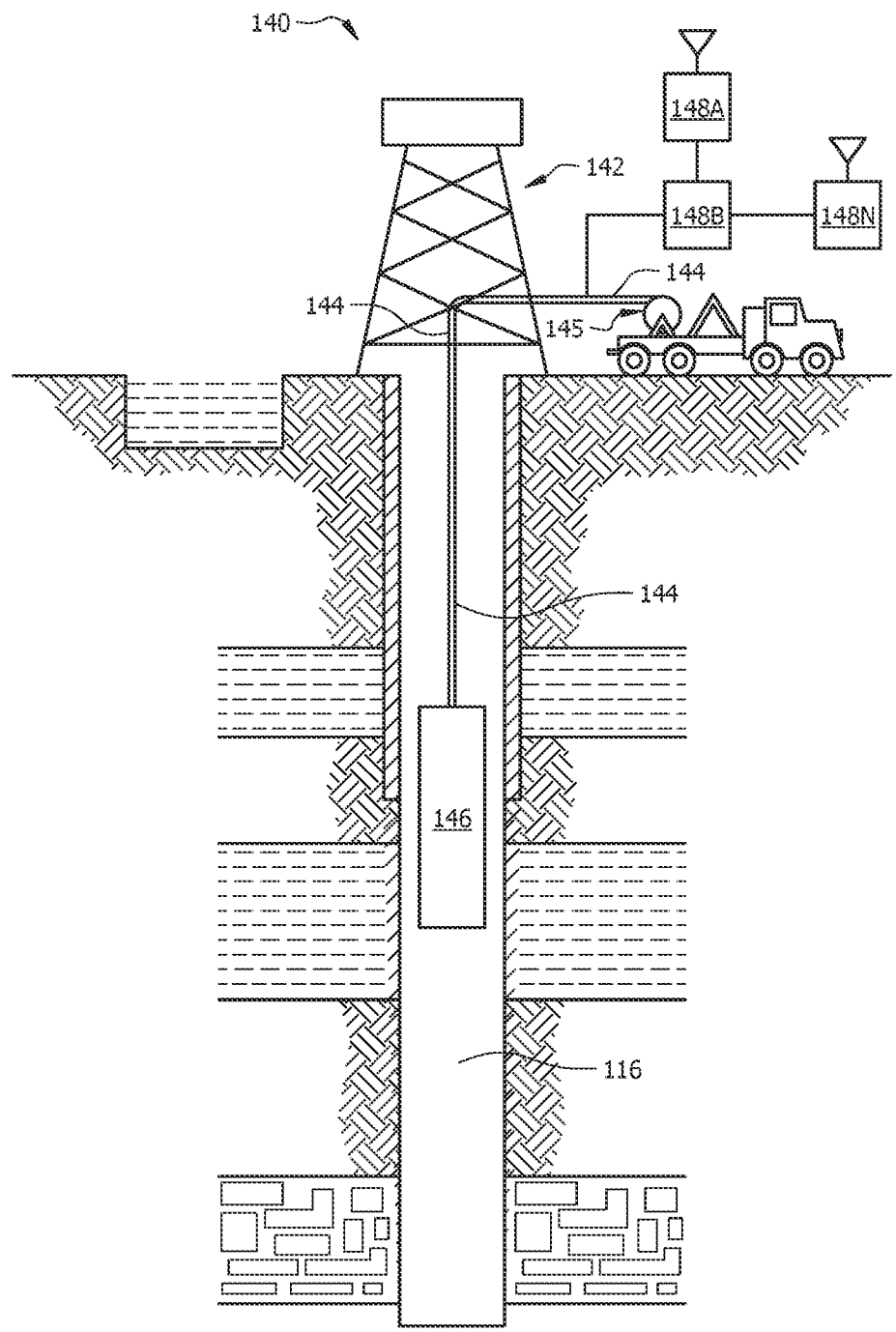
FIG. 1B is a diagram illustrating another exemplary environment for a downhole tool with a receive antenna and proximate amplifier according to the present disclosure.

Referring to FIG. 1B, an example system 140 for downhole line detection in a downhole environment can employ a tool having a tool body 146 in order to carry out logging and/or other operations. The tool body 146 may be or include the downhole tool 200 of FIG. 2. In this environment, rather than using a drill string 108 of FIG. 1A to lower tool body 146 and which can contain sensors and/or other instrumentation for detecting and logging nearby characteristics and conditions of the wellbore 116 and surrounding formations, the drill string can be withdrawn and a conduit 144 employed (referred to as "wireline"). The tool body 146 can include a resistivity logging tool. The tool body 146 can be lowered into the wellbore 116 by conduit 144. The conduit 144 can be anchored in the drill rig 145 or by a portable means such as a truck. The conduit 144 can include one or more wires, slicklines, cables, and/or the like, as well as tubular conduits such as coiled tubing, joint tubing, or other tubulars.

The illustrated conduit 144 provides power and support for the tool, as well as enabling communication between tool processors 148A-N on the surface. In some examples, the conduit 144 can include electrical and/or fiber optic cabling for carrying out communications. The conduit 144 is sufficiently strong and flexible to tether the tool body 146 through the wellbore 116, while also permitting communication through the conduit 144 to one or more processors 148A-N, which can include local and/or remote processors. Moreover, power can be supplied via the conduit 144 to meet power requirements of the tool. For slickline or coiled tubing configurations, power can be supplied downhole with a battery or via a downhole generator.

It should be noted that while FIGS. 1A and 1B generally depict a land-based operation, the principles described herein are equally applicable to operations that employ floating or sea-based platforms and rigs, without departing from the scope of the disclosure. Also, even though FIGS. 1A and 1B depict a vertical wellbore, the present disclosure is equally well-suited for use in wellbores having other orientations, including horizontal wellbores, slanted wellbores, multilateral wellbores or the like.

Figure 2:
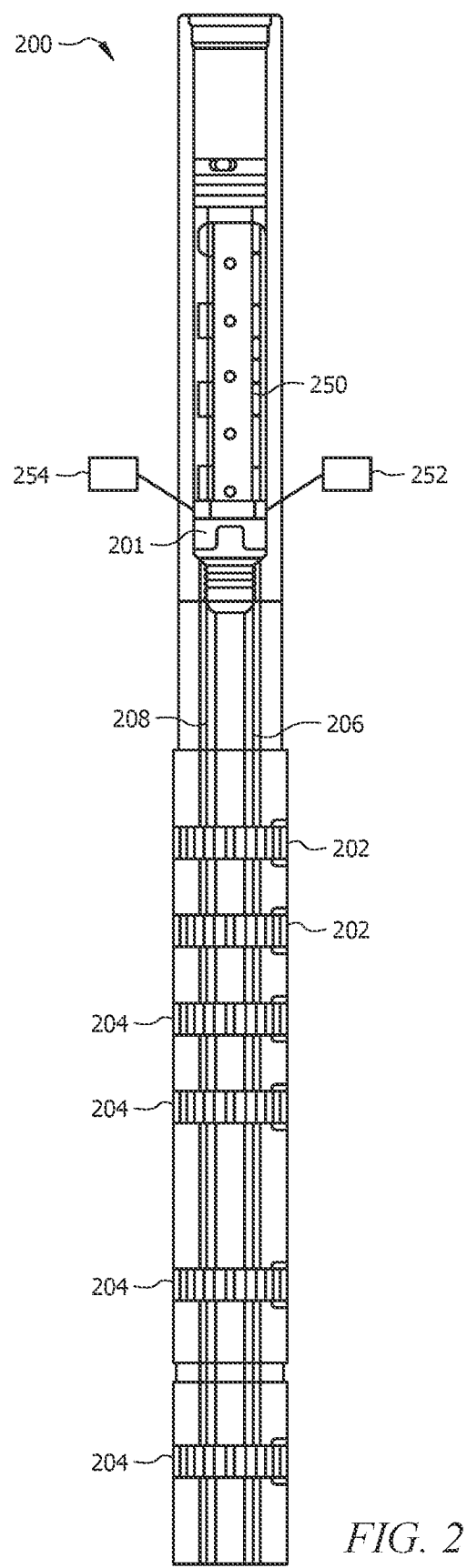
FIG. 2 is a diagram illustrating a downhole tool with a receiver sensor, including multiple receiver antennas and proximate amplifiers, according to the present disclosure.

FIG. 2 is a diagram illustrating a downhole tool 200 with a receive antenna and a receive amplifier proximate to and coupled to the receive antenna, according to an example of the present disclosure. As shown, a connector ring 201 acts as an interface between an electronics carrier 250 and receiver sensors 202, and between the electronics carrier 250 and transmitter sensors 204. In examples of this description, the connector ring 201 enables the downhole tool 200 to use a singular connector ring 201 for both transmitter and receiver signals. As shown in FIG. 2, a first end of the connector ring 201 connects to one or more receiver sensors 202 with receiver sensor cables (e.g., conductors) 206, and to one or more transmitter sensors 204 with transmitter sensor cables (e.g., conductors) 208.

As described above, the downhole tool 200 is a transmitter- and receiver-based downhole tool 200, which is facilitated by the receiver sensors 202 and the transmitter sensors 204. For example, the downhole tool 200 is a resistivity logging tool 200. In such a resistivity logging tool 200, the transmitter sensors 204 are configured to transmit a signal (e.g., of a single frequency at a time) into a surrounding rock formation 118. The transmitted signal travels through the formation 118 and is received by the receiver sensors 202, potentially with differences in its voltage and/or phase between the multiple receiver sensors 202. A resistivity of the formation 118 can be determined responsive to a difference between signals received by the multiple receiver sensors 202. The electronics carrier 250 enables information exchange (e.g., by regulating the content and timing of signal transmissions between the surface computer and the downhole tool 200). The electronics carrier 250 also controls the operation of the downhole tool 200, such as responsive to signals and/or data received by the receiver sensors 202. The receiver sensors 202 and the transmitter sensors 204 may include antennas that receive and transmit signals, respectively.

The electronics carrier 250 may include processing systems 252, 254 that perform various operations on signal(s) and/or data received from the receiver sensors 202 or being sent to the transmitter sensors 204. For example, once receiver signals from the receiver sensors 202 are provided to the electronics carrier 250, the receiver signals are processed using the receiver processing system 252 (e.g., to determine resistivity measurements of the surrounding formation 118). Similarly, before signals are sent to the transmitter sensors 204 by the electronics carrier 250, such signals are processed using (or generated by) the transmitter processing system 254. As described above, it is useful to combine the receiver electronics and the transmitter electronics (e.g., including the processing systems 252, 254) into a single electronics carrier 250. For example, the downhole tool 200 using the single electronics carrier 250 may reduce a cost of the downhole tool 200, may reduce a length or form factor of the downhole tool 200, or both.

However, proximity between transmitter electronics 254 and receiver electronics 252 (e.g., in the single electronics carrier 250) may lead to unwanted coupling or crosstalk between transmitter and receiver signals. The crosstalk or interference, or environmental noise, has a particular effect on receiver signals (e.g., those from the receiver sensors 202), which may be a relatively weaker strength due to having been received from an antenna (e.g., wirelessly). By contrast, transmit signals (e.g., to be sent to the transmitter sensors 204) are amplified signals to be provided to a transmit antenna, and are thus relatively stronger and less susceptible to crosstalk or interference/noise. The presence of interference and/or noise, including environmental noise, in any signal(s) may lead to undesired behavior such as measurement offset and/or errors.

To address the foregoing, the receiver sensor(s) 202 of the downhole tool 200 include a receive antenna and a receive amplifier proximate to and coupled to the receive antenna. In some cases, the receive antenna and receive amplifier are integrated into a single receiver sensor 202, or insert. For example, the receive antenna and receive amplifier may be co-located on a receiver circuit board of the receiver sensor 202. The receive amplifier is configured to amplify a signal received by the receive antenna before the signal is transmitted to the electronics carrier 250 of the downhole tool 200. Accordingly, the impact of noise, such as environmental noise, or interference (e.g., crosstalk) on the received signal is reduced.

Figure 3:
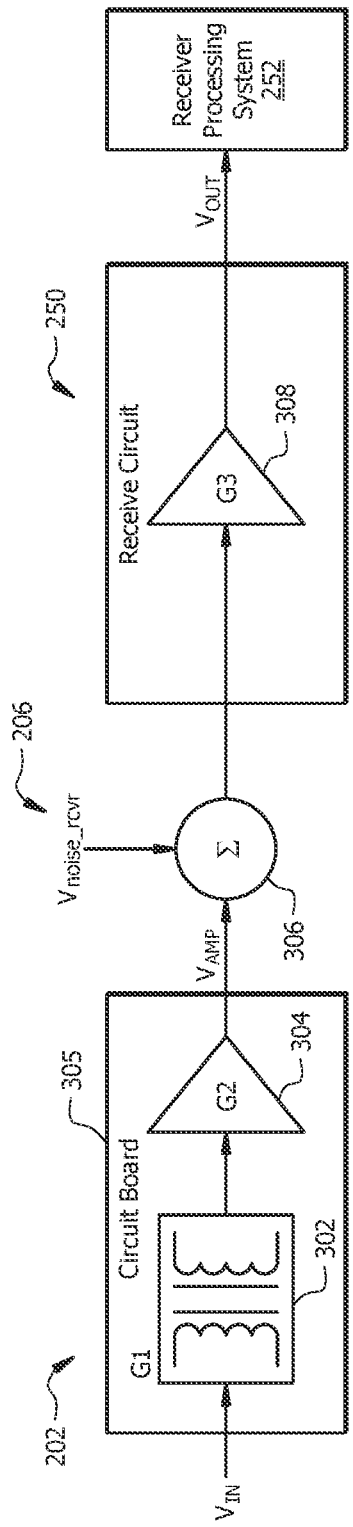
FIG. 3 is a circuit diagram of a receiver sensor, including a receive antenna and proximate amplifier, and an electronics carrier, of a downhole tool according to the present disclosure.

FIG. 3 is a schematic circuit diagram of a receiver sensor 202 coupled to the electronics carrier 250 by a conductor 206. As described, the receiver sensor 202 includes a receive antenna 302, which is represented by a transformer having a gain G1. The receiver sensor 202 also includes proximate amplifier 304, which has a gain G2. The receive antenna 302 is configured to receive a signal (e.g., wirelessly), such as a signal from the surrounding formation 118 that was transmitted by the transmitter sensor 204. In the example of FIG. 3, VIN represents a signal voltage of the signal received by the receive antenna 302 wirelessly from the transmitter sensor 204 via the surrounding formation 118. The proximate amplifier 304 is shown as a single amplifier for simplicity. However, in other examples, the proximate amplifier 304 may be multiple, cascaded amplifiers that combine to provide the gain G2. The receive antenna 302 and the proximate amplifier 304 (or multiple proximate amplifiers 304) can be co-located on a circuit board 305 as shown, or be in close proximity, such as within a same enclosure. In another example, the receive antenna 302 and the proximate amplifier 304 can be co-located on a single integrated circuit (e.g., the circuit board 305 is implemented as a single integrated circuit), such as an application-specific integrated circuit (ASIC). Regardless of the particular implementation, because the receiver sensor 202 includes the proximate amplifier 304, the receiver sensor is configured to provide an amplified signal (VAMP) responsive to the signal received by the receive antenna 302 (VIN). In the example of FIG. 3, VAMP=VIN*G1*G2. The proximate amplifier 304 thus amplifies VIN before transmitting the amplified signal VAMP to electronics carrier 250. As described, the electronics carrier 250 is positioned axially away from the receiver sensor 202, and is thus also positioned axially away from each of the receive antenna 302 and the proximate amplifier 304.

As described above, the receiver sensor 202 is adapted to be coupled to an electronics carrier, such as the electronics carrier 250, which includes receiver electronics 252. However, noise can be added to the amplified signal (VAMP) while it travels from the receiver sensor 202 to the electronics carrier 250 over the conductor 206. Noise can also be added to the amplified signal (VAMP) by the transmitter electronics of the electronics carrier 250. This noise is generally represented by a signal voltage Vnoise_revr, which is added to VAMP as shown schematically by the voltage adder 306.

The electronics carrier 250 thus receives the amplified signal plus any additional noise component, as VIN*G1*G2+Vnoise_revr. Receive circuitry of the electronics carrier 250 can include a second amplifier 308, which has a gain G3. In an example, the gain G3 provided by the amplifier 308 of the electronics carrier 250 is less than the gain G2 provided by the proximate amplifier 304 of the receiver sensor 202. The second amplifier 308 is thus configured to provide a second amplified signal (VOUT) responsive to the signal received from the receiver sensor 202. In the example of FIG. 3, VOUT=(VIN*G1*G2+ Vnoise_revr)*G3. The receive circuitry of the electronics carrier 250 can also include the receiver processing system 252, which receives and processes the amplified signal VOUT.

By providing the amplifier 304 proximate to and coupled to the receive antenna 302, the impact of noise or interference (e.g., crosstalk) on the received signal (VIN) is reduced. For example, by amplifying the received signal (VIN) proximate to the receive antenna 302, before transmitting the amplified signal VAMP to the electronics carrier 250, a SNR of the system including the receiver sensor 202 and the electronics carrier 250 is increased. For example, the signal portion of VOUT is given by VIN*G1*G2*G3, while the noise portion of VOUT is given by Vnoise_revr*G3. Accordingly, converting to decibels (dB), $$SNR = 20*\log[(VIN*G1*G2*G3)/(Vnoise\_revr*G3)]$$
$$= 20*\log(VIN/Vnoise\_revr*G1*G2).$$

As demonstrated, the proximate amplifier 304 gain G2 increases the SNR relative to a receiver sensor that does not include any proximate signal amplification, in which the G2 term is not present in the SNR calculation. As described above, in some examples the downhole tool 200 includes multiple such receiver sensors 202.

Figure 4:
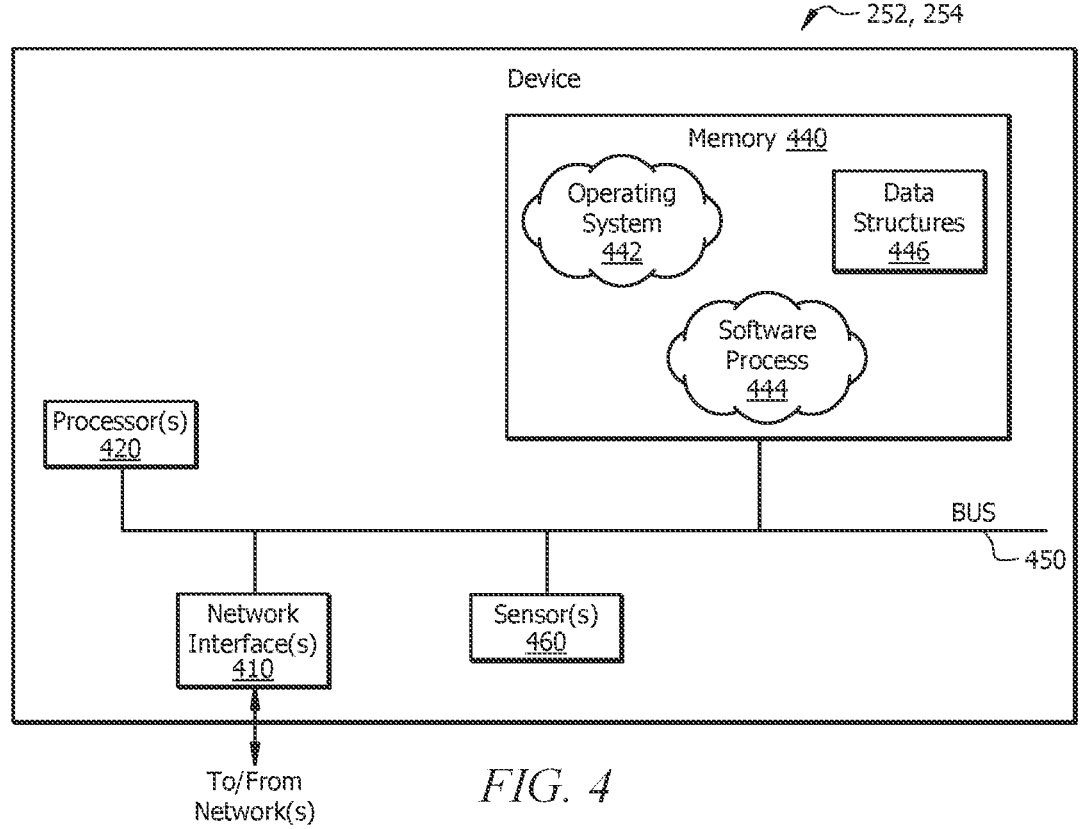
FIG. 4 is a diagram of a processing system that may be employed as shown in FIG. 2.

FIG. 4 is a block diagram of an exemplary processing system for the receiver processing system (e.g., including receiver electronics of the electronics carrier 250) 252 and the transmitter processing system (e.g., including transmitter electronics of the electronics carrier 250) 254. Processing systems 252, 254 are configured to perform processing of data and communicate with one or more of the above discussed components and may also be configured to communication with remote devices/systems.

As shown, processing systems 252, 254 include hardware and software components such as network interfaces 410, at least one processor 420, sensors 460 and a memory 440 interconnected by a system bus 450. Network interface (s) 410 can include mechanical, electrical, and signaling circuitry for communicating data over communication links, which may include wired or wireless communication links. Network interfaces 410 are configured to transmit and/or receive data using a variety of different communication protocols, as will be understood by those skilled in the art.

Processor 420 represents a digital signal processor (e.g., a microprocessor, a microcontroller, or a fixed-logic processor, etc.) configured to execute instructions or logic to perform tasks in a wellbore environment. Processor 420 may include a general-purpose processor, special-purpose processor (where software instructions are incorporated into the processor), a state machine, application specific integrated circuit (ASIC), a programmable gate array (PGA) including a field PGA, an individual component, a distributed group of processors, and the like. Processor 420 typically operates in conjunction with shared or dedicated hardware, including but not limited to, hardware capable of executing software and hardware. For example, processor 420 may include elements or logic adapted to execute software programs and manipulate data structures 446, which may reside in memory 440.

Sensors 460, which may include sensors of downhole tools 200 as disclosed herein, typically operate in conjunction with processor 420 to perform measurements, and can include special-purpose processors, detectors, transmitters, receivers, and the like. In this fashion, sensors 460 may include hardware/software for generating, transmitting, receiving, detection, logging, and/or sampling magnetic fields, seismic activity, and/or acoustic waves, temperature, pressure, radiation levels, casing collar locations, weights, torques, tool health (such as voltage levels and current monitors), accelerations, gravitational fields, strains, video recordings, flow rates, solids concentration, solids size, chemical composition, and/or other parameters.

Memory 440 comprises a plurality of storage locations that are addressable by processor 420 for storing software programs and data structures 446 associated with the embodiments described herein. An operating system 442, portions of which may be typically resident in memory 440 and executed by processor 420, functionally organizes the device by, inter alia, invoking operations in support of software processes and/or services 444 executing on processing systems 252, 254. These software processes and/or services 444 may perform processing of data and communication with processing systems 252, 254, as described herein. Note that while process/service 444 is shown in centralized memory 440, some examples provide for these processes/services to be operated in a distributed computing network.

Other processor and memory types, including various computer-readable media, may be used to store and execute program instructions pertaining to the fluidic channel evaluation techniques described herein. Also, while the description illustrates various processes, it is expressly contemplated that various processes may be embodied as modules having portions of the process/service 444 encoded thereon. Accordingly, the program modules may be encoded in one or more tangible computer readable storage media for execution, such as with fixed logic or programmable logic (e.g., software/computer instructions executed by a processor, and any processor may be a programmable processor, programmable digital logic such as field PGAs or an ASIC that comprises fixed digital logic. In general, any process logic may be embodied in processor 420 or computer-readable medium encoded with instructions for execution by processor 420 that, when executed by the processor, are operable to cause the processor to perform the functions described herein.

Figure 5:
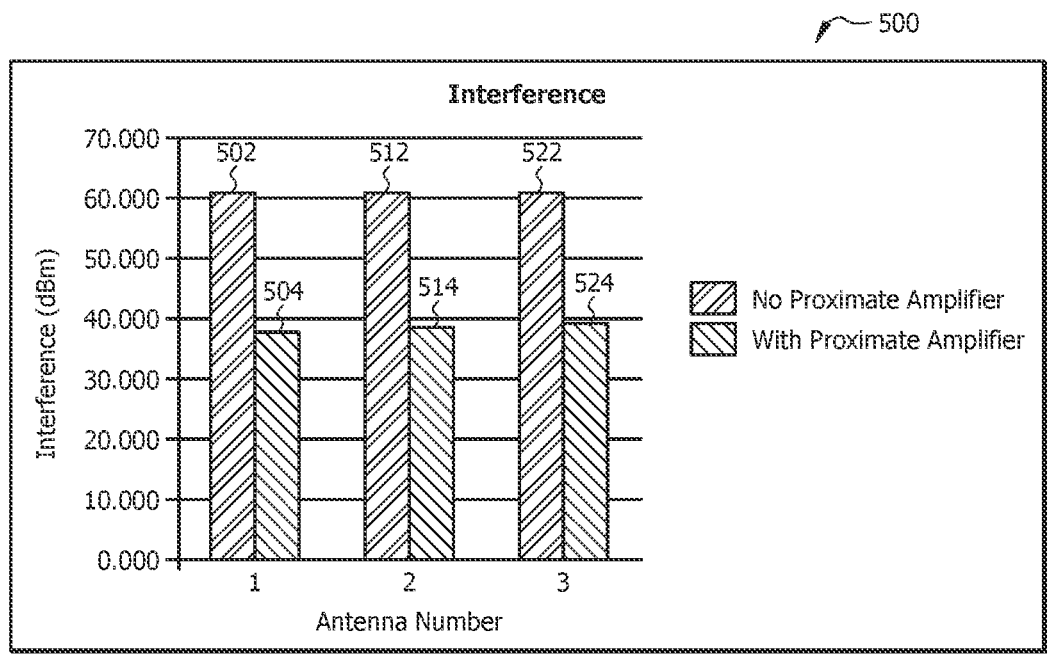
FIG. 5 is a chart comparing interference in a downhole tool using the receiver sensor described herein, in accordance with aspects of the present disclosure.

FIG. 5 is a chart 500 comparing interference/crosstalk between the receiver sensor 202 of this description, in which a proximate amplifier 304 is provided along with the receive antenna 302, and another receiver sensor in which signal amplification is provided at receiver circuitry of the electronics carrier (e.g., which is positioned axially away from the receive antenna 302). The amount of interference/crosstalk present in a downhole tool without proximate amplifier 304 coupled to the receive antenna 302 is plotted in FIG. 5 as 502, 512, 522. The amount of interference/crosstalk present in a downhole tool with receiver sensor(s) 202 that include the proximate amplifier 304 coupled to the receive antenna 302 is plotted in FIG. 5 as 504, 514, 524. A comparison between corresponding measurements (e.g., between 502 and 504, 512 and 514, and 522 and 524) shows a reduction in interference/crosstalk when using the proximate amplifier 304 coupled to the receive antenna 302 in accordance with examples described herein, as indicated by the decreased interference (dB) values.

Figure 6:
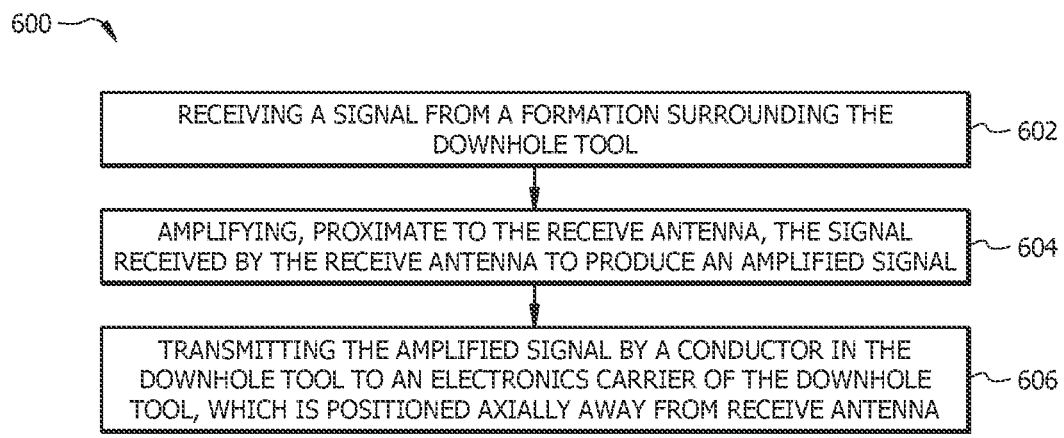
FIG. 6 is a flow chart of a method for amplifying a received signal in a downhole tool according to the present disclosure.

FIG. 6 is a flow chart of a method 600 for amplifying a received signal (e.g., VIN) in a downhole tool (e.g., downhole tool 200) in accordance with examples described herein. The method 600 begins in block 602 with receiving a signal from external to the downhole tool, such as from a formation 118 surrounding the downhole tool. The received signal is shown as VIN in FIG. 3 above, and is received by the receive antenna 302 of a receiver sensor 202 of the downhole tool 200. In an example, the receive antenna 302 adds a gain of G1 to the received signal VIN, resulting in an output signal of VIN*G1.

The method 600 continues in block 604 with amplifying the received signal to produce an amplified signal. As explained above, the proximate amplifier 304 receives the signal VIN*G1 from the receive antenna 302 and adds a gain of G2 to the received signal, thus providing an amplified signal VAMP=VIN*G1*G2.

The method 600 continues in block 606 with transmitting the amplified signal VAMP by a conductor 206 in the downhole tool 200 to an electronics carrier 250 of the downhole tool 200. As described above, the electronics carrier 250 is positioned axially away from the receiver sensor 202, which contains the receive antenna 302. Accordingly, the amplified signal VAMP is produced proximate to the receive antenna 302 (e.g., by the proximate amplifier 304) and before the amplified signal VAMP is transmitted to the electronics carrier 250 by the conductor 206.

By providing the amplified signal VAMP proximate to the receive antenna 302, the method 600 reduces the impact of noise or interference (e.g., crosstalk) on the signal received and processed, for example by the electronics carrier. As described above, by amplifying the received signal (VIN) proximate to the receive antenna 302, before transmitting the amplified signal VAMP to the electronics carrier 250, a SNR of the system including the receiver sensor 202 and the electronics carrier 250 is increased.

ADDITIONAL DISCLOSURE

The following are non-limiting, specific embodiments in accordance with the present disclosure:

A first embodiment, which is a downhole tool, comprising a receive antenna configured to receive a signal from a surrounding formation, a receive amplifier proximate to and coupled to the receive antenna, the receive amplifier configured to provide an amplified signal responsive to the signal received by the receive antenna, and an electronics carrier including receive circuitry coupled to the receive amplifier by a conductor, wherein the electronics carrier is positioned axially away from the receive antenna and the receive amplifier, and wherein the receive circuitry is configured to receive and process the amplified signal.

A second embodiment, which is the downhole tool of the first embodiment, wherein the receive antenna and the receive amplifier are co-located on a receiver circuit board, or exist in close proximity of a same enclosure.

A third embodiment, which is the downhole tool of any of the first and the second embodiments, wherein the receive amplifier is a first receive amplifier, the amplified signal is a first amplified signal, and the receive circuitry comprises a second receive amplifier configured to receive the first amplified signal and provide or process a second amplified signal responsive to the first amplified signal.

A fourth embodiment, which is the downhole tool of the third embodiment, wherein a gain provided by the first receive amplifier is greater than a gain provided by the second receive amplifier.

A fifth embodiment, which is the downhole tool of any of the first through the fourth embodiments, wherein the receive antenna is a first receive antenna, the receive amplifier is a first receive amplifier, the amplified signal is a first amplified signal, the conductor is a first conductor, and the downhole tool further comprises a second receive antenna configured to receive a signal from the surrounding formation, a second receive amplifier proximate to and coupled to the second receive antenna, the second receive amplifier configured to provide a second amplified signal responsive to the signal received by the second receive antenna, wherein the receive circuitry of the electronics carrier is coupled to the second receive amplifier by a second conductor, wherein the electronics carrier is positioned axially away from the second receive antenna and the second receive amplifier, and wherein the receive circuitry is configured to receive and process the second amplified signal.

A sixth embodiment, which is the downhole tool of any of the first through the fifth embodiments, further comprising a transmit antenna configured to transmit the signal to the receive antenna through the surrounding formation, wherein the electronics carrier includes transmit circuitry configured to provide the signal to the transmit antenna.

A seventh embodiment, which is the downhole tool of any of the first through the sixth embodiments, wherein the receive amplifier being proximate to the receive antenna and providing the amplified signal over the conductor to the receive circuitry reduces interference.

An eighth embodiment, which is a method, comprising receiving, at a receive antenna of a downhole tool, a signal from a surrounding formation, amplifying the signal received by the receive antenna to produce an amplified signal, and transmitting the amplified signal by a conductor in the downhole tool to an electronics carrier of the downhole tool, wherein the electronics carrier is positioned axially away from the receive antenna, wherein the amplified signal is produced proximate to the receive antenna, and before the signal is transmitted by the conductor to the electronics carrier.

A ninth embodiment, which is the method of the eighth embodiment, wherein the amplifying is by a receive amplifier co-located on a receiver circuit board with the receive antenna.

A tenth embodiment, which is the method of any of the eighth and the ninth embodiments, wherein the amplified signal is a first amplified signal, the method further comprising amplifying, by receive circuitry of the electronics carrier, the first amplified signal to produce a second amplified signal, and providing or processing, by the receive circuitry, the second amplified signal.

An eleventh embodiment, which is the method of the tenth embodiment, wherein a gain to produce the first amplified signal is greater than a gain to produce the second amplified signal.

A twelfth embodiment, which is the method of any of the eighth through the eleventh embodiments, wherein the receive antenna is a first receive antenna, the amplified signal is a first amplified signal, and the conductor is a first conductor, the method further comprising receiving, at a second receive antenna of the downhole tool, a signal from the surrounding formation, amplifying the signal received by the second receive antenna to produce a second amplified signal, and transmitting the second amplified signal by a second conductor in the downhole tool to the electronics carrier, wherein the electronics carrier is positioned axially away from the second receive antenna, wherein the second amplified signal is produced proximate to the second receive antenna, and before the signal is transmitted by the second conductor to the electronics carrier.

A thirteenth embodiment, which is the method of any of the eighth through the twelfth embodiments, further comprising transmitting, by a transmit antenna, the signal to the receive antenna through the surrounding formation.

A fourteenth embodiment, which is the method of any of the eighth through the thirteenth embodiments, wherein producing the amplified signal proximate to the receive antenna, and before the signal is transmitted to the electronics carrier reduces interference.

A fifteenth embodiment, which is a receiver sensor of a downhole tool, the receiver sensor comprising a receive antenna configured to receive a signal from a surrounding formation of the downhole tool, and a receive amplifier proximate to and coupled to the receive antenna, the receive amplifier configured to provide an amplified signal responsive to the signal received by the receive antenna, wherein the receive amplifier is adapted to be coupled to an electronics carrier, including receive circuitry, by a conductor, and wherein the receiver sensor is configured to be positioned axially away from the electronics carrier in a downhole tool.

A sixteenth embodiment, which is the receiver sensor of the fifteenth embodiment, further comprising a circuit board that includes the receive antenna and the receive amplifier.

A seventeenth embodiment, which is the receiver sensor of any of the fifteenth and the sixteenth embodiments, further comprising an integrated circuit that includes the receive antenna and the receive amplifier.

An eighteenth embodiment, which is the receiver sensor of any of the fifteenth through the seventeenth embodiments, wherein the receive amplifier is a first receive amplifier, the amplified signal is a first amplified signal that is configured to be again amplified by a second receive amplifier of the receive circuitry.

A nineteenth embodiment, which is the receiver sensor of the eighteenth embodiment, wherein a gain provided by the first receive amplifier is configured to be greater than a gain provided by the second receive amplifier.

A twentieth embodiment, which is the receiver sensor of any of the fifteenth through the nineteenth embodiments, a signal-to-noise ratio of the amplified signal is reduced responsive to the receive amplifier being proximate to the receive antenna and providing the amplified signal over the conductor to the receive circuitry.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Use of the term "optionally" with respect to any element of a claim is intended to mean that the subject element may be present in some embodiments and not present in other embodiments. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of this disclosure. Thus, the claims are a further description and are an addition to the embodiments of this disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. A downhole tool, comprising:
a transmit antenna configured to transmit a signal to a surrounding formation;
a receive antenna configured to receive the signal from the surrounding formation;
a receive amplifier proximate to and coupled to the receive antenna, the receive amplifier configured to provide an amplified signal responsive to the signal received by the receive antenna; and
a single insert electronics carrier including transmit circuitry configured to provide the signal to the transmit antenna, and receive circuitry coupled to the receive amplifier by a conductor;
wherein the electronics carrier is positioned axially away from the receive antenna and the receive amplifier; and
wherein the receive circuitry is configured to receive and process the amplified signal.

2. The downhole tool of claim 1, wherein the receive antenna and the receive amplifier are co-located on a receiver circuit board, or exist in close proximity of a same enclosure.

3. The downhole tool of claim 1, wherein:
the receive amplifier is a first receive amplifier;
the amplified signal is a first amplified signal; and
the receive circuitry comprises a second receive amplifier configured to receive the first amplified signal and provide or process a second amplified signal responsive to the first amplified signal.

4. The downhole tool of claim 3, wherein a gain provided by the first receive amplifier is greater than a gain provided by the second receive amplifier.

5. The downhole tool of claim 1, wherein:
the receive antenna is a first receive antenna;
the receive amplifier is a first receive amplifier;
the amplified signal is a first amplified signal;
the conductor is a first conductor; and
the downhole tool further comprises:
a second receive antenna configured to receive a signal from the surrounding formation;
a second receive amplifier proximate to and coupled to the second receive antenna, the second receive amplifier configured to provide a second amplified signal responsive to the signal received by the second receive antenna;
wherein the receive circuitry of the electronics carrier is coupled to the second receive amplifier by a second conductor;
wherein the electronics carrier is positioned axially away from the second receive antenna and the second receive amplifier; and
wherein the receive circuitry is configured to receive and process the second am amplified signal.

6. The downhole tool of claim 1; wherein the receive amplifier being proximate to the receive antenna and providing the amplified signal over the conductor to the receive circuitry reduces interference.

7. A method, comprising:
transmitting, by a transmit antenna of a downhole tool, a signal into a surrounding formation;
receiving, at a receive antenna of the downhole tool, the signal from the surrounding formation;
amplifying the signal received by the receive antenna to produce an amplified signal; and
transmitting the amplified signal by a conductor in the downhole tool to an electronics carrier of the downhole tool, wherein the electronics carrier is a single insert, positioned axially away from the receive antenna, and includes transmit circuitry that is configured to provide the signal to the transmit antenna;
wherein the amplified signal is produced proximate to the receive antenna, and before the signal is transmitted by the conductor to the electronics carrier.

8. The method of claim 7, wherein the amplifying is by a receive amplifier co-located on a receiver circuit board with the receive antenna.

9. The method of claim 7, wherein the amplified signal is a first amplified signal, the method further comprising:
amplifying, by receive circuitry of the electronics carrier, the first amplified signal to produce a second amplified signal; and providing or processing, by the receive circuitry, the second amplified signal.

10. The method of claim 9, wherein a gain to produce the first amplified signal is greater than a gain to produce the second amplified signal.

11. The method of claim 7, wherein:
the receive antenna is a first receive antenna;
the amplified signal is a first amplified signal; and
the conductor is a first conductor;
the method further comprising:
   receiving, at a second receive antenna of the downhole tool, a signal from the surrounding formation;
   amplifying the signal received by e second receive antenna to produce a second amplified signal; and
   transmitting the second amplified signal by a second conductor in the downhole tool to the electronics carrier, wherein the electronics carrier is positioned axially away from the second receive antenna;
wherein the second amplified signal s produced proximate to the second receive antenna, and before the signal is transmitted by the second conductor to the electronics carrier.

12. The method of claim 7, wherein producing the amplified signal proximate to the receive antenna, and before the signal is transmitted to the electronics carrier reduces interference.

13. A receiver sensor of a downhole tool, the receiver sensor comprising:
   a receive antenna configured to receive a signal from a surrounding formation of the downhole tool; and
   a receive amplifier proximate to and coupled to the receive antenna, the receive amplifier configured to provide an amplified signal responsive to the signal received by the receive antenna;
wherein the receive amplifier is adapted to be coupled to a single insert electronics carrier, including receive circuitry, by a conductor;
wherein the electronics carrier includes transmit circuitry configured to provide the signal to a transmit antenna; and
wherein the receiver sensor is configured to be positioned axially away from the electronics carrier in a downhole tool.

14. The receiver sensor of claim 13, further comprising a circuit board that includes the receive antenna and the receive amplifier.

15. The receiver sensor of claim 13, further comprising an integrated circuit that includes the receive antenna and the receive amplifier.

16. The receiver sensor of claim 13, wherein:
the receive amplifier is a first receive amplifier;
the amplified signal is a first amplified signal that is configured to be again amplified by a second receive amplifier of the receive circuitry.

17. The receiver sensor of claim 16, wherein a gain provided by the first receive amplifier is configured to be greater than a gain provided by the second receive amplifier.

18. The receiver sensor of claim 13, a signal-to-noise ratio of the amplified signal is reduced responsive to the receive amplifier being proximate to the receive antenna and providing the amplified signal over the conductor to the receive circuitry.

* * * * *